US012573338B2

(12) United States Patent
Sun et al.

(10) Patent No.: US 12,573,338 B2
(45) Date of Patent: Mar. 10, 2026

(54) GATE DRIVE CIRCUIT AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Feixiang Sun, Wuhan (CN); Hongyan Liu, Wuhan (CN); Yi Liu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/991,720

(22) Filed: Dec. 23, 2024

(65) Prior Publication Data

US 2025/0124858 A1    Apr. 17, 2025

Related U.S. Application Data

(63) Continuation of application No. 18/502,076, filed on Nov. 5, 2023, now Pat. No. 12,223,887.

(30) Foreign Application Priority Data

Jun. 27, 2023    (CN) .......................... 202310772777.9

(51) Int. Cl.
  *G09G 3/32*        (2016.01)
  *G11C 19/28*       (2006.01)

(52) U.S. Cl.
  CPC ............. *G09G 3/32* (2013.01); *G11C 19/287* (2013.01); *G09G 2300/0819* (2013.01); *G09G 2300/0852* (2013.01); *G09G 2310/0267* (2013.01); *G09G 2310/0286* (2013.01); *G09G 2310/08* (2013.01)

(58) Field of Classification Search
  CPC ............. G09G 3/32; G09G 2300/0819; G09G 2300/0852; G09G 2310/0267; G09G 2310/0286; G09G 2310/08; G09G 3/20; G09G 3/3266; G11C 19/287; G11C 19/28
  See application file for complete search history.

(56) References Cited

U.S. PATENT DOCUMENTS

2020/0020410 A1*  1/2020  Du ......................... G11C 19/28
2022/0076618 A1*  3/2022  Lai ...................... G09G 3/3266
2022/0398968 A1*  12/2022  Wang ................... G09G 3/2096

* cited by examiner

*Primary Examiner* — Hong Zhou
(74) *Attorney, Agent, or Firm* — PV IP PC; Wei Te Chung

(57)        ABSTRACT

A gate drive circuit and a display panel. The gate drive circuit includes one or more shift register groups. Each of the shift register groups includes N shift adjacent registers that output in sequence, with N being an integer greater than or equal to 3. Each of the shift registers includes a first output stage and a frequency division control module. The first output stage is configured to output a gate drive signal. The frequency division control module is configured to control outputting of the gate drive signal based on a refresh frequency. A control end of each frequency division control module in each of the shift register groups receives a control signal with a different phase and a same frequency, respectively, to adjust a pulse width of the gate drive signal and maintain a same pulse width at different refresh frequencies.

17 Claims, 9 Drawing Sheets

Control

Nscan1<1~800>

Nscan1<801>

Nscan1<802>

Nscan1<803>

Nscan1<804>

GATE DRIVE CIRCUIT AND DISPLAY PANEL

CROSS-REFERENCE TO RELATED APPLICATION

This application is a U.S. continuation of U.S. non-provisional application Ser. No. 18/502,076, filed on Nov. 5, 2023, which claims priority to and the benefit of Chinese Patent Application No. 202310772777.9, filed on Jun. 27, 2023, the contents of the aforementioned patent applications are incorporated herein by reference in their entireties.

TECHNICAL FIELD

The present disclosure relates to the field of display technologies, and in particular, to a gate drive circuit and a display panel.

BACKGROUND

A GOA (Gate On Array, integrating a gate drive on an array substrate) circuit may also be referred to as a gate drive circuit. Each shift register in the gate drive circuit outputs one or more gate drive signals.

With development of display technologies, frequency division display requires the gate drive circuit to satisfy display requirements at different refresh frequencies. However, pulse widths of gate drive signals are limited in the frequency division display.

SUMMARY

The present disclosure provides a gate drive circuit and a display panel.

According to a first aspect, the present disclosure provides a gate drive circuit. The gate drive circuit includes one or more shift register groups. Each of the shift register groups includes N shift adjacent registers that output in sequence, with N being an integer greater than or equal to 3. Each of the shift registers includes a first output stage and a frequency division control module. The first output stage is configured to output a gate drive signal. The frequency division control module is configured to control outputting of the gate drive signal based on a refresh frequency. A control end of each frequency division control module in each of the shift register groups receives a control signal with a different phase and a same frequency, respectively, to adjust a pulse width of the gate drive signal and maintain a same pulse width at different refresh frequencies.

According to a second aspect, the present disclosure provides a display panel. The display panel includes a pixel circuit and a gate drive circuit. The gate drive circuit includes one or more shift register groups. Each of the shift register groups includes N shift adjacent registers that output in sequence, with N being an integer greater than or equal to 3. Each of the shift registers includes a first output stage and a frequency division control module. The first output stage is configured to output a gate drive signal. The frequency division control module is configured to control outputting of the gate drive signal based on a refresh frequency. A control end of each frequency division control module in each of the shift register groups receives a control signal with a different phase and a same frequency, respectively, to adjust a pulse width of the gate drive signal and maintain a same pulse width at different refresh frequencies. The pixel circuit includes a drive transistor, a compensation transistor and a write transistor. A first electrode of the compensation transistor is connected to a gate of the drive transistor. A second electrode of the compensation transistor is connected to a first electrode or a second electrode of the drive transistor. A gate of the compensation transistor receives a gate drive signal. A first electrode of the write transistor is connected to the first electrode or the second electrode of the drive transistor. A second electrode of the write transistor is connected to a data line. A gate of the write transistor is connected to a scan line.

BRIEF DESCRIPTION OF THE DRAWINGS

The following describes embodiments of the present disclosure with reference to the accompanying drawings, to make the technical solutions and beneficial effects obvious.

DETAILED DESCRIPTION

The following clearly and completely describes the technical solutions in embodiments of the present disclosure with reference to the accompanying drawings in embodiments of the present disclosure. Obviously, the described embodiments are merely some rather than all of embodiments of the present disclosure. All other embodiments obtained by a person skilled in the art based on embodiments of the present disclosure without inventive efforts shall fall within the protection scope of the present disclosure.

In addition, terms "first" and "second" are used merely for the purpose of description, and shall not be as indicating or implying relative importance or implying a quantity of indicated technical features. Therefore, a feature restricted by "first" or "second" may explicitly indicate or implicitly include at least one such feature. In description of the present disclosure, "multiple" means at least two, unless it is specifically defined otherwise.

Figure 1:
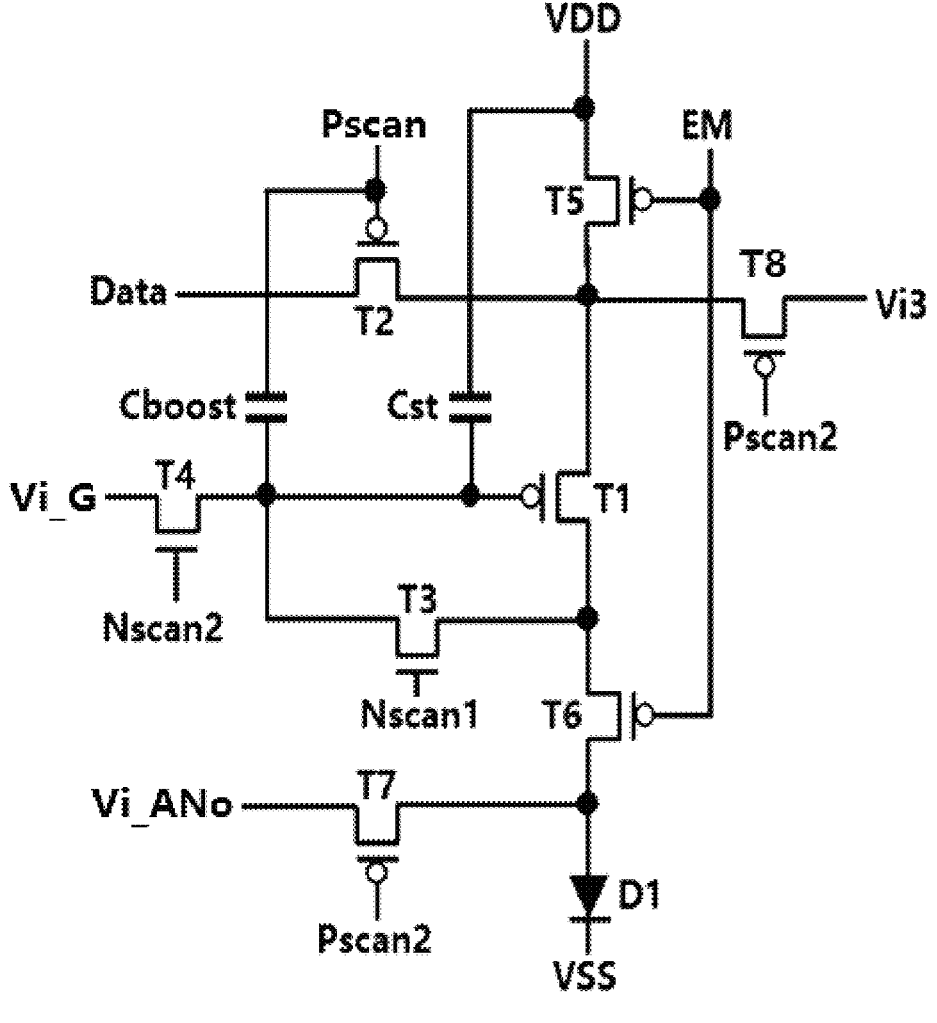
FIG. 1 is a schematic diagram of a structure of a pixel circuit according to an embodiment of the present disclosure.

FIG. 1 is a schematic diagram of a structure of a pixel circuit according to an embodiment of the present disclosure. In the pixel circuit, a first electrode of a compensation transistor T3 is connected to a gate of a drive transistor T1, a second electrode of the compensation transistor T3 is connected to the first electrode or a second electrode of the drive transistor T1, and a gate of the compensation transistor T3 is connected to a gate drive line. A first electrode of a write transistor T2 is connected to the first electrode or the second electrode of the drive transistor T1, a second electrode of the write transistor T2 is connected to a data line, and a gate of the write transistor T2 is connected to a scan line.

The drive transistor T1 and the write transistor T2 both are P-channel low-temperature polycrystalline silicon thin film transistors, and can improve dynamic performance of the pixel circuit. The compensation transistor T3 is an N-channel indium gallium zinc oxide thin film transistor, and can reduce leakage currents of the gate of the drive transistor T1, so that a gate potential of the drive transistor T1 can be maintained easily at a low refresh frequency.

A first electrode may be one of a source or a drain, and a second electrode may be the other. For example, when the first electrode is a source, the second electrode is a drain. Or, when the first electrode is a source, the second electrode is a drain.

The data line is configured to transmit a data signal Data. The gate drive line is configured to transmit a gate drive signal Nscan1. The scan line is configured to transmit a scan signal Pscan.

Figure 2:
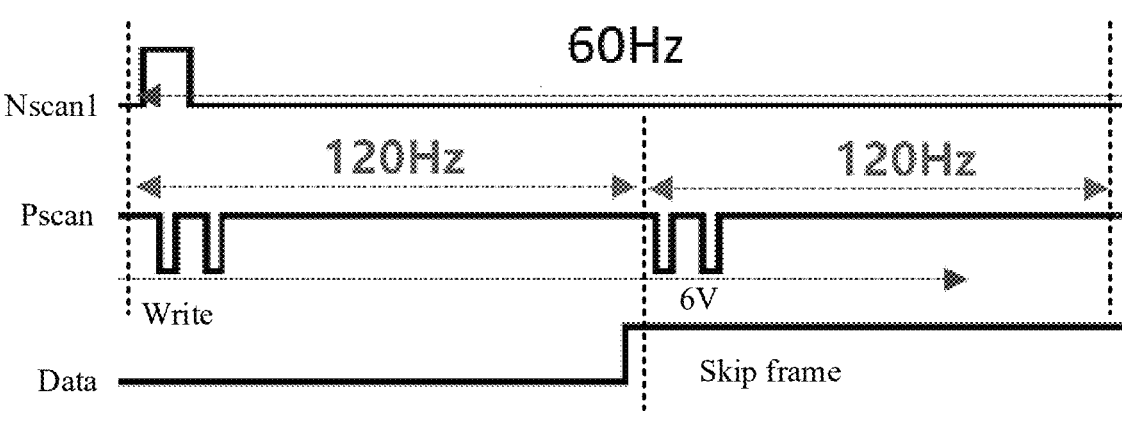
FIG. 2 is a schematic diagram of a time sequence of the pixel circuit shown in FIG. 1.

As shown in FIG. 2, for example, a highest refresh frequency of the pixel circuit is 120 Hz. When a frame is displayed at a refresh frequency of 60 Hz, the frame can be divided into a write frame of 120 Hz and a holding frame of 120 Hz.

In the write frame, at least part of a pulse of the scan signal Pscan is covered by a pulse of the gate drive signal Nscan1, so that the write transistor T2 and the compensation transistor T3 are turned on synchronously, and the data signal Data is written to the gate of the drive transistor T1.

In the holding frame, the gate drive signal Nscan1 does not have a pulse, while the scan signal Pscan still has a pulse same as a pulse of the write frame. In this case, the data signal Data can only be written in a source and/or a drain of the drive transistor, and is not written in the gate of the drive transistor T1. Thus, the holding frame is also referred to as a skip frame.

In the write frame, duration in which the pulse of the scan signal Pscan is covered by the pulse of the gate drive signal Nscan can ensure expected charging time. Therefore, it is necessary to maintain stability of a pulse width of the gate drive signal Nscan1, and this requires a corresponding gate drive circuit.

Figure 3:
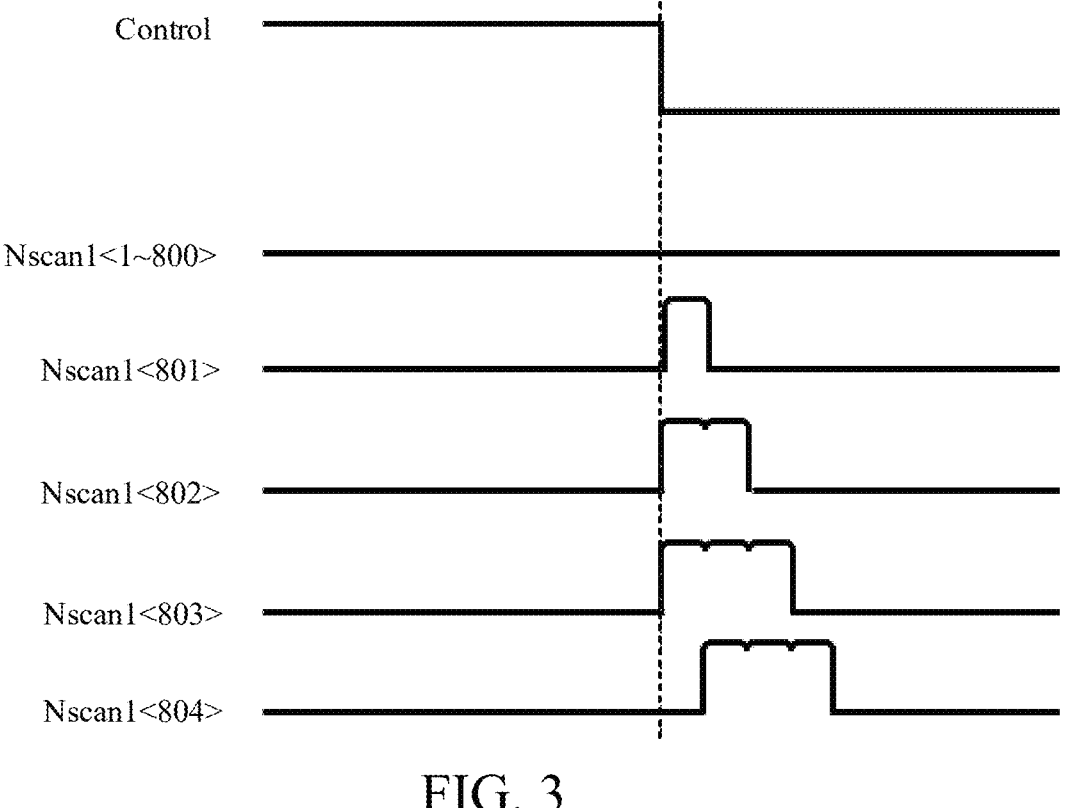
FIG. 3 is a schematic diagram of a time sequence of a gate drive circuit in related technologies.
Figure 7:
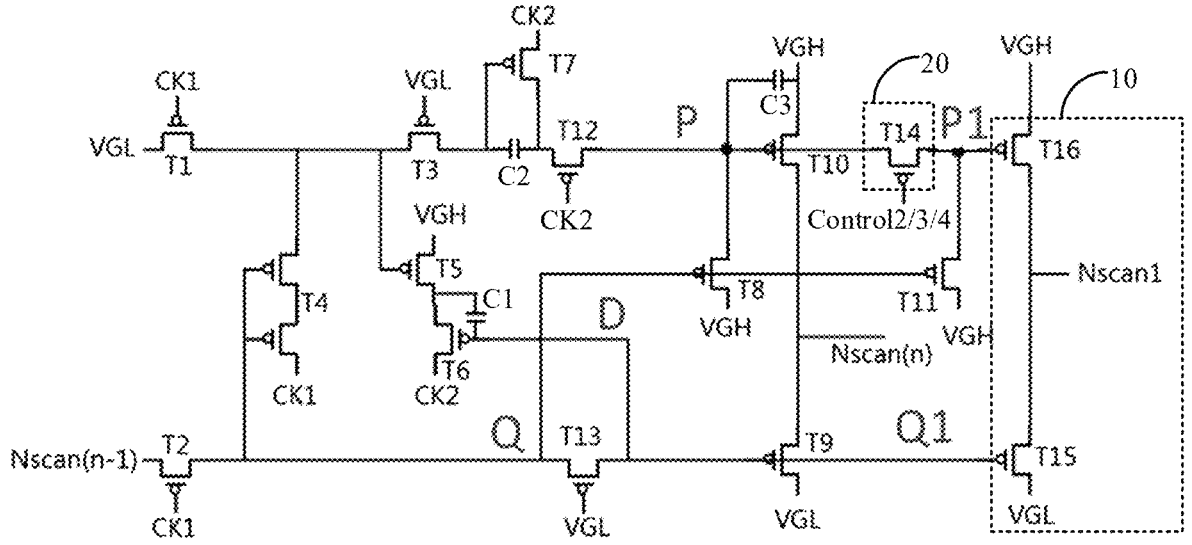
FIG. 7 is a schematic diagram of a first structure of a shift register according to an embodiment of the present disclosure.
Figure 8:
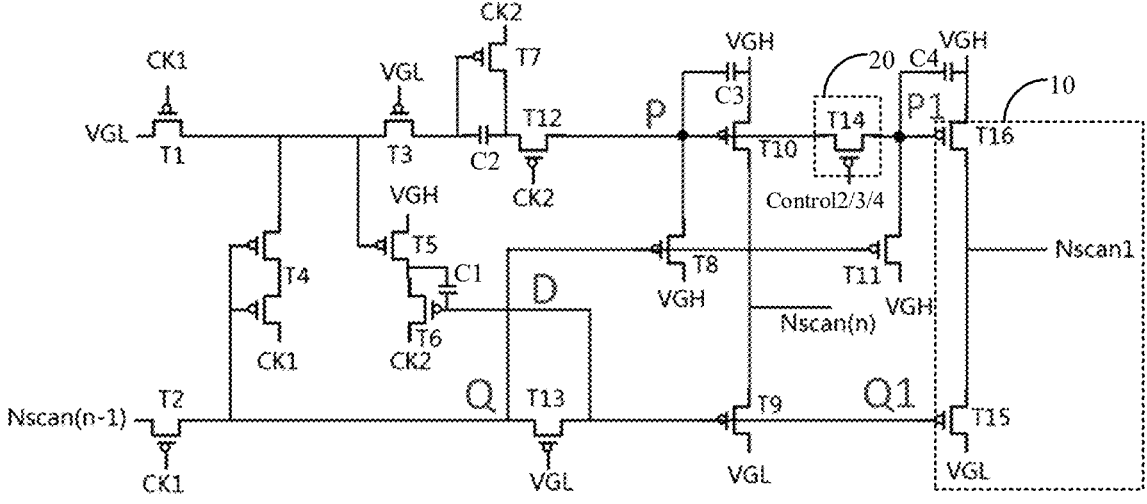
FIG. 8 is a schematic diagram of a second structure of a shift register according to an embodiment of the present disclosure.
Figure 9:
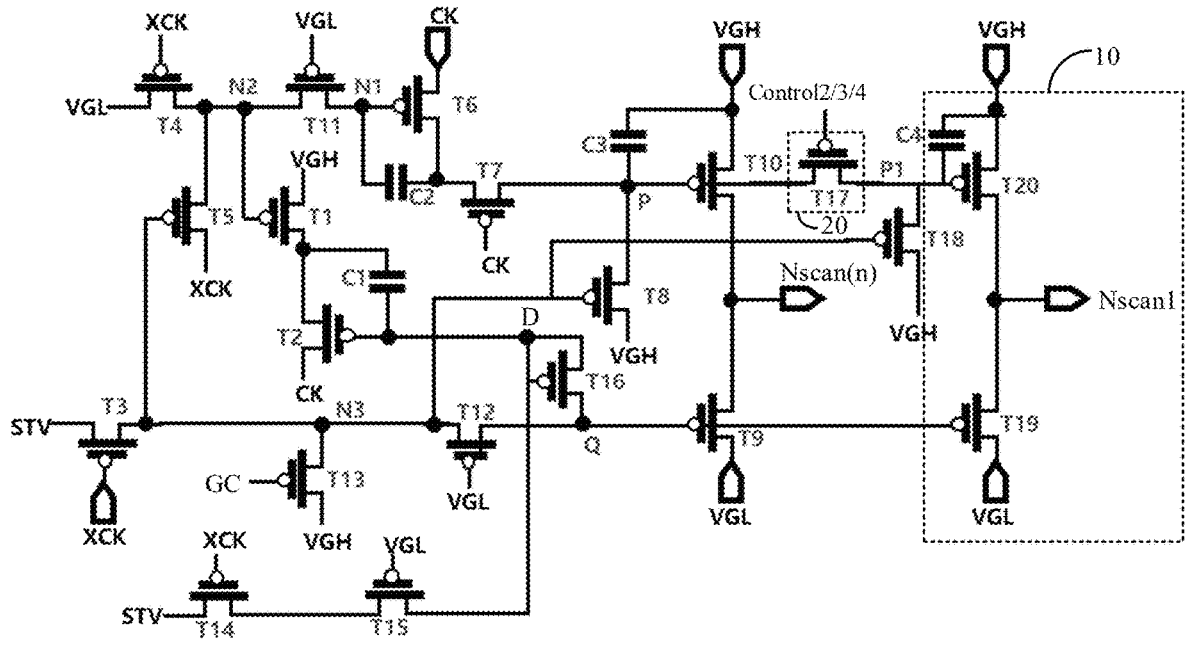
FIG. 9 is a schematic diagram of a third structure of a shift register according to an embodiment of the present disclosure.

Specifically, as shown in FIG. 3, in a related gate drive circuit, the gate drive circuit may include a plurality of cascaded shift registers, and theses shift registers may be any one of those shown in FIG. 7 to FIG. 9. Control ends of frequency division control modules in all the shift registers in a same gate drive circuit all receive a same control signal Control. When the control signal Control is at a high potential, all the shift registers output gate drive signals such as Nscan1<1-800>, Nscan1<801>, Nscan1<802>, Nscan1<802>, Nscan1<803>, and Nscan1<804> that are at low potentials and do not have pulses. In this case, pixel circuits controlled by a first-stage shift register to an 800th-stage shift register perform display at a refresh frequency.

When an 801st-stage shift register, an 802nd-stage shift register, an 803rd-stage shift register, an 804th-stage shift register, and subsequent shift registers are needed to control corresponding pixel circuits to perform display at another refresh frequency, the control signal Control is switched from a high potential to a low potential. In this way, the 801st-stage shift register, the 802nd-stage shift register, the 803rd-stage shift register, the 804th-stage shift register, and subsequent shift registers output gate drive signals such as Nscan1<801>, Nscan1<802>, Nscan1<803>, and Nscan1<804> that have pulses.

However, because there are defects in the gate drive circuit in related technologies, the pulse width of the gate drive signal is narrow in an initial stage of refresh frequency switching in frequency division display. For example, in FIG. 3, a pulse width of the gate drive signal Nscan1<801> is only a half clock cycle, and a pulse width of the gate drive signal Nscan1<802> is only one clock cycle. This reduces charging time of the data signal Data for the pixel circuit, resulting in display abnormality. Pulse widths of expected or normal gate drive signals such as Nscan1<803> and Nscan1<804> are kept same, for example, one and a half clock cycles.

In view of the foregoing technical problem that the pulse width of the gate drive signal Nscan1 is narrow in an initial stage of refresh frequency switching in frequency division display, the present embodiment provides a gate drive circuit. Refer to FIG. 4 to FIG. 11. The gate drive circuit includes one or more shift register groups 111, wherein each of the shift register groups 111 includes N adjacent shift registers arranged that output in sequence, with N being an integer greater than or equal to 3. Each of the shift registers includes a first output stage 10 and a frequency division control module 20. The first output stage 10 is configured to output a gate drive signal Nscan1. The frequency division control module 20 is configured to control outputting of the gate drive signal Nscan1 based on a refresh frequency. A control end of each frequency division control module 20 in each of the shift register groups 111 receives a control signal with a different phase and a same frequency, respectively, to adjust a pulse width of the gate drive signal Nscan1 and maintain a same pulse width at different refresh frequencies.

It should be understood that, in the gate drive circuit provided in the present embodiment, control ends of the frequency division control modules 20 in three or more adjacent shift registers that output in sequence receive control signals with different phases, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan1 can remain unchanged in a case of refresh frequency switching, thereby mitigating a problem that the pulse width of the gate drive signal Nscan1 is narrow in an initial stage of refresh frequency switching in frequency division display.

In addition, each of control signals in different phases may increase a half clock cycle for the pulse width of the gate drive signal Nscan1, so that the pulse width of the gate drive signal Nscan1 can be controlled more precisely, and the pulse width of the gate drive signal Nscan1 can be adjusted more flexibly.

In one embodiment, the shift register group 111 includes a first shift register, a second shift register, and a third shift register that output gate drive signals Nscan1 with sequentially lagged phases. The control signals include a first control signal Control2, a second control signal Control3, and a third control signal Control4. A frequency of the first control signal Control2, a frequency of the second control signal Control3, and a frequency of the third control signal Control4 are all same. A phase of the first control signal Control2, a phase of the second control signal Control3, and a phase of the third control signal Control4 are sequentially lagged. In each of the shift register groups 111, a control end of a frequency division control module 20 in the first shift register receives the first control signal Control2, a control end of a frequency division control module 20 in the second shift register receives the second control signal Control3, and a control end of a frequency division control module 20 in the third shift register receives the third control signal Control4.

Figure 10:
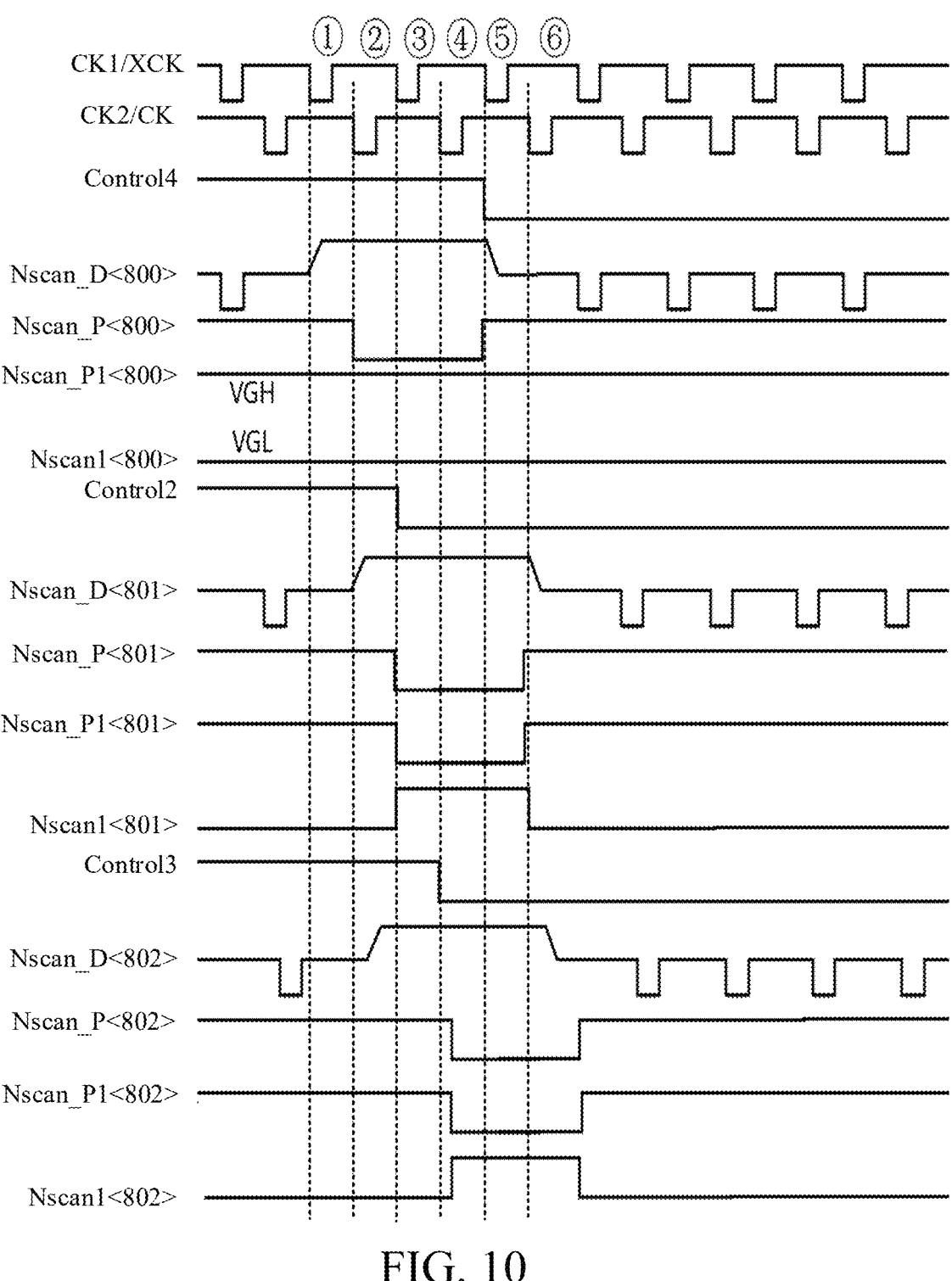
FIG. 10 is a schematic diagram of a time sequence of the shift register shown in FIG. 8 to FIG. 10.

It should be noted that, in the present embodiment, it can be ensured that a pulse width of each gate drive signal Nscan1 is one and a half clock cycles, and the clock cycle may be a cycle of a first clock signal CK1/XCK or a cycle of a second clock signal CK2/CK in FIG. 10. In addition, the pulse width of the gate drive signal Nscan1 can be maintained as one and a half clock cycles in a case of the refresh frequency switching.

In one embodiment, as shown in FIG. 10, an interval exists between a pulse start edge of the first control signal Control2 and a pulse start edge of the second control signal Control3, and the interval exists between the pulse start edge of the second control signal Control3 and a pulse start edge of the third control signal Control4.

It should be noted that the interval is a half clock cycle. This facilitates improvement of stability of the pulse width of the gate drive signal Nscan1.

For a positive pulse, the pulse start edge is a rising edge of the pulse. Alternatively, for a negative pulse, the pulse start edge is a falling edge of the pulse.

In one embodiment, the pulse width of the gate drive signal Nscan1 is a product of N and the interval.

It should be noted that, based on the present embodiment, the pulse width of the gate drive signal Nscan1 can be adjusted more flexibly and stably. For example, a value of N can be adjusted by increasing a quantity of shift registers in each of the shift register groups 111 and a quantity of control signals. Alternatively, a value of N can be adjusted by adjusting a length of the interval.

Figure 5:
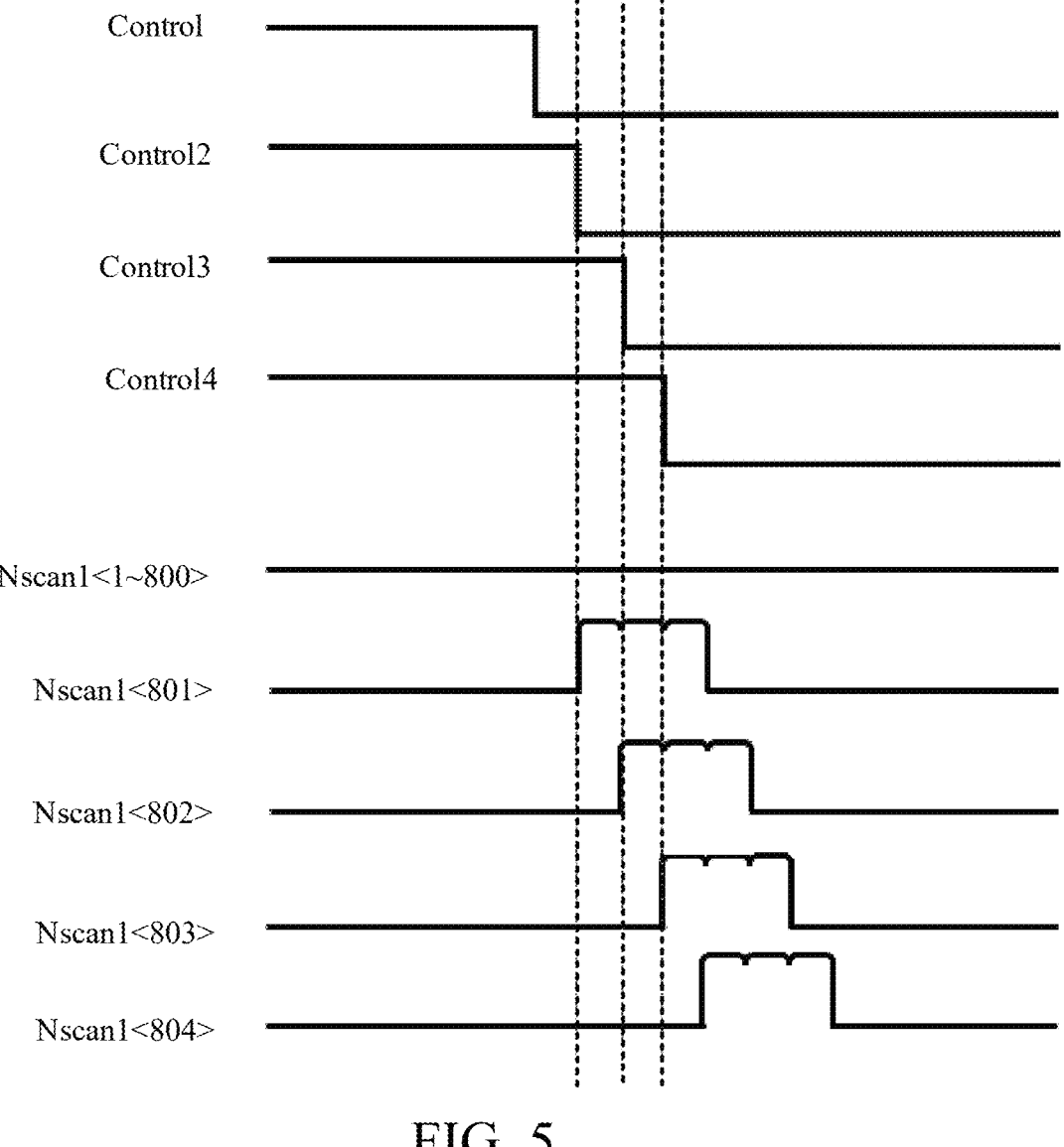
FIG. 5 is a schematic diagram of a time sequence of the gate drive circuit shown in FIG. 4.

In one embodiment, as shown in FIG. 5, the first shift register outputs a first gate drive signal, the second shift register outputs a second gate drive signal, and the third shift register outputs a third gate drive signal. An interval exists between a pulse start edge of the first gate drive signal and a pulse start edge of the second gate drive signal, and the interval exists between the pulse start edge of the second gate drive signal and a pulse start edge of the third gate drive signal.

It should be noted that a phase difference between pulse drive signals that are adjacent and are outputted in sequence is the interval.

The first gate drive signal may be Nscan1<801>, the second gate drive signal may be Nscan1<802>, and the third gate drive signal may be Nscan1<803>.

In one embodiment, as shown in FIG. 5, the pulse start edge of the first control signal Control2 is at a same time as the pulse start edge of the first gate drive signal, the pulse start edge of the second control signal Control3 is at a same time as the pulse start edge of the second gate drive signal, and the pulse start edge of the third control signal Control4 is at a same time as a pulse start edge of the third gate drive signal.

It should be noted that a start time of the pulse of the first gate drive signal may be controlled by the first control signal Control2 via a corresponding frequency division control module 20. A start time of the pulse of the second gate drive signal may be controlled by the second control signal Control3 via a corresponding frequency division control module 20. A start time of the pulse of the third gate drive signal may be controlled by the third control signal Control4 via a corresponding frequency division control module 20.

Figure 4:
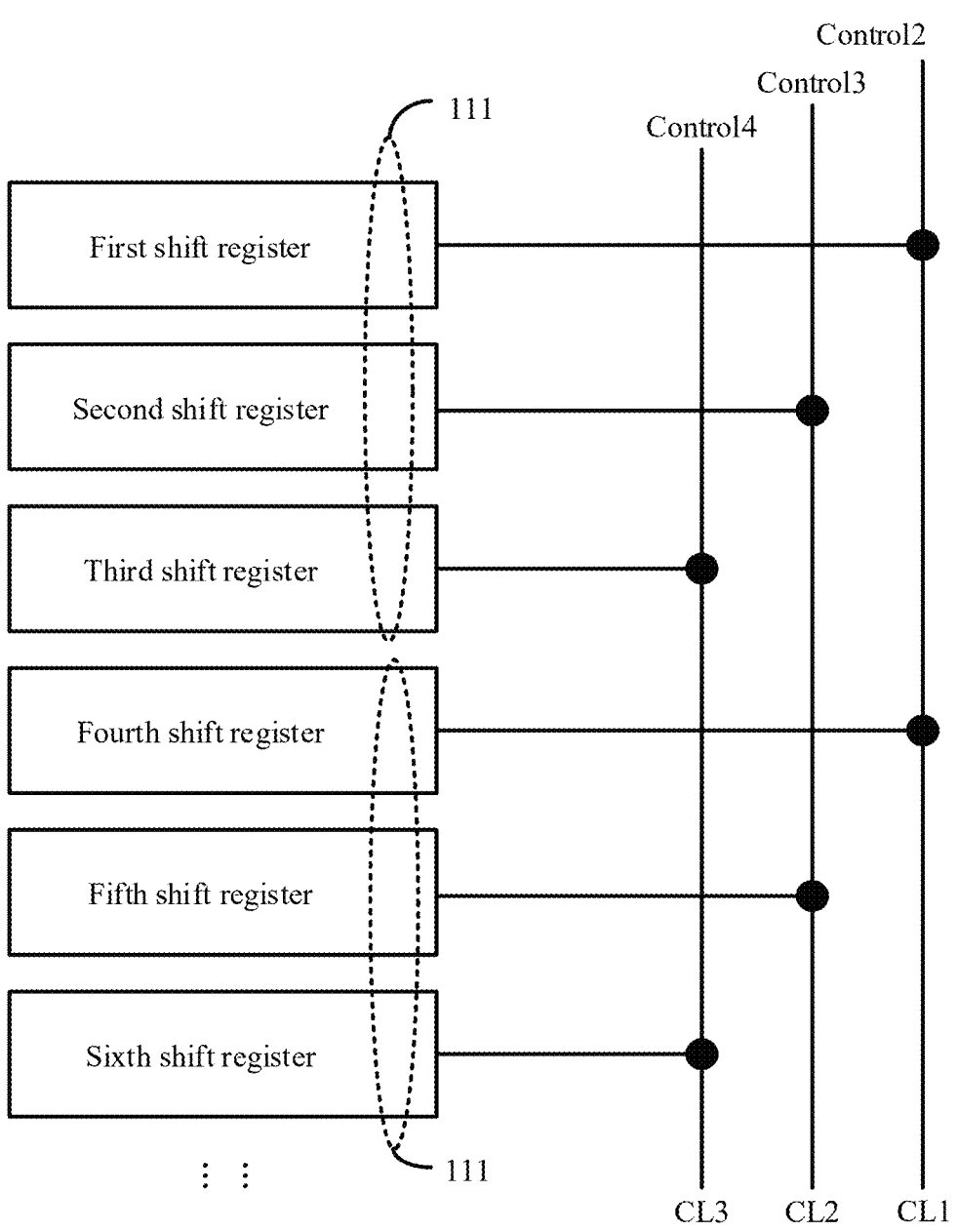
FIG. 4 is a schematic diagram of a structure of a gate drive circuit according to an embodiment of the present disclosure.

In one embodiment, as shown in FIG. 4, each control signal is transmitted via a control line, and the control line comprises a first control line CL1, a second control line CL2 and a third control line CL3. Each of the shift register groups 111 includes a first shift register, a second shift register, and a third shift register that output gate drive signals Nscan1 with sequentially lagged phases. The first control line CL1 is connected to a control end of a frequency division control module 20 of the first shift register in each of the shift register groups 111, the second control line CL2 is connected to a control end of a frequency division control module 20 of the second shift register in each of the shift register groups 111, and the third control line CL3 is connected to a control end of a frequency division control module 20 of the third shift register in each of the shift register groups 111.

It should be noted that, in the present embodiment, stability and adjustment of the pulse width of the gate drive signal Nscan1 can be achieved though cyclic connection with each of the shift register groups 111 via three control lines. This reduces a quantity of the control lines, and facilitates implementation of a narrower frame.

In one embodiment, the control line further includes a fourth control line, each of the shift register groups 111 further includes a fourth shift register, and the fourth control line is connected to a control end of a frequency division control module 20 of the fourth shift register in each of the shift register groups 111.

It should be noted that, in the present embodiment, N is equal to 4. In this way, the pulse width of the gate drive signal Nscan1 is increased to two clock cycles. In scenarios with other requirements, the pulse width of the gate drive signal Nscan1 may alternatively be increased by increasing the value of N to, for example, 5, 6, 7, or 8 based on the inventive concept of the present disclosure.

In one embodiment, the first control line CL1, the second control line CL2, the third control line CL3, and the fourth control line respectively transmit the first control signal Control2, the second control signal Control3, the third control signal Control4, and a fourth control signal; a frequency of the first control signal Control2, a frequency of the second control signal Control3, a frequency of the third control signal Control4, and a frequency of the fourth control signal are all same; and a phase of the first control signal Control2, a phase of the second control signal Control3, a phase of the third control signal Control4, and a phase of the fourth control signal are sequentially lagged.

It should be noted that, in the present embodiment, frequency division control modules 20 in each register groups are controlled by four gate drive signals Nscan1 with sequentially lagged phases, so that the pulse width of the gate drive signal Nscan1 can be stabilized within two clock cycles.

In one embodiment, refer to FIG. 4 to FIG. 11. The gate drive circuit includes N sequentially cascaded shift registers, and N is greater than or equal to 3. Each shift register includes a first output stage 10 and a frequency division control module 20. A first control end of the first output stage 10 is connected to a first pull-up node P1, a second control end of the first output stage 10 is connected to a first pull-down node Q1 in FIG. 7 and FIG. 8 or a first pull-down node Q in FIG. 9, and an output end of the first output stage 10 is connected to a gate drive line. An end of the frequency division control module 20 is connected to the first pull-up node P1, and another end of the frequency division control module 20 is connected to a second pull-up node P. Control ends of frequency division control modules 20 in N shift registers are respectively connected to N control lines that transmit control signals in different phases, and the control end of the frequency division control module 20 in each shift register is connected to a control line.

It should be understood that, in the gate drive circuit provided in the present embodiment, control ends of the frequency division control modules 20 in three or more sequentially cascaded shift registers receive control signals with different phases via different control lines, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan1 can remain unchanged in a case of refresh frequency switching, thereby mitigating a problem that the pulse width of the gate drive signal Nscan1 is narrow in an initial stage of refresh frequency switching in frequency division display.

In addition, each of control signals in different phases may increase a half clock cycle for the pulse width of the gate drive signal Nscan1, so that the pulse width of the gate drive signal Nscan1 can be controlled more precisely, and the pulse width of the gate drive signal Nscan1 can be adjusted more flexibly.

In one embodiment, as shown in FIG. 4, the N shift registers include a first shift register, a second shift register, and a third shift register cascaded sequentially. The N control lines that transmit control signals in different phases include the first control line CL1, the second control line CL2 and the third control line CL3 that transmit control signals with sequentially lagged phases. One of the first shift register, the second shift register, and the third shift register is connected to one of the first control line CL1, the second control line CL2, and the third control line CL3. Another of the first shift register, the second shift register, and the third shift register is connected to another of the first control line CL1, the second control line CL2, and the third control line CL3. The remaining one of the first shift register, the second shift register, and the third shift register is connected to the remaining one of the first control line CL1, the second control line CL2, and the third control line CL3.

It should be noted that the first control line CL1 may be configured to transmit the first control signal Control2. The second control line CL2 may be configured to transmit the second control signal Control3. The third control line CL3 may be configured to transmit the third control signal Control4. Phases of the first control signal Control2, the second control signal Control3, and the third control signal Control4 are sequentially lagged, and frequencies of the first control signal Control2, the second control signal Control3, and the third control signal Control4 are all same.

In one embodiment, as shown in FIG. 4, the control end of the frequency division control module 20 in the first shift register is connected to the first control line CL1, the control end of the frequency division control module 20 in the second shift register is connected to the second control line CL2, and the control end of the frequency division control module 20 in the third shift register is connected to the third control line CL3.

It should be noted that, as a specific implementation of the foregoing embodiment, similarly, in the present embodiment, control ends of the frequency division control modules 20 in three or more sequentially cascaded shift registers receive the control signals with different phases via different control lines, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan1 can remain unchanged in a case of refresh frequency switching, thereby mitigating the problem that the pulse width of the gate drive signal Nscan1 is narrow in an initial stage of refresh frequency switching in frequency division display.

In one embodiment, the control end of the frequency division control module 20 in the first shift register is connected to the second control line CL2, the control end of the frequency division control module 20 in the second shift register is connected to the third control line CL3, and the control end of the frequency division control module 20 in the third shift register is connected to the first control line CL1.

It should be noted that, as another specific implementation of the foregoing embodiment, similarly, in the present embodiment, control ends of the frequency division control modules 20 in three or more sequentially cascaded shift registers receive the control signals with different phases via different control lines, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan1 can remain unchanged in a case of refresh frequency switching, thereby mitigating a problem that the pulse width of the gate drive signal Nscan1 is narrow in an initial stage of refresh frequency switching in frequency division display.

In one embodiment, the control end of the frequency division control module 20 in the first shift register is connected to the third control line CL3, the control end of the frequency division control module 20 in the second shift register is connected to the first control line CL1, and the control end of the frequency division control module 20 in the third shift register is connected to the second control line CL2.

It should be noted that, as still another implementation of the foregoing embodiment, similarly, in the present embodiment, control ends of the frequency division control modules 20 in three or more sequentially cascaded shift registers receive the control signals with different phases via different control lines, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan can remain unchanged in a case of refresh frequency switching, thereby mitigating the problem that the pulse width of the gate drive signal Nscan1 is narrow in an initial stage of refresh frequency switching in frequency division display.

In one embodiment, the N shift registers further include a fourth shift register cascaded after the third shift register. The N control lines that transmit control signals in different phases further includes a fourth control line. A phase of a control signal transmitted by the fourth control line is lagged than a phase of the control signal transmitted by the third control line CL3. Yet another of the first shift register, the second shift register, the third shift register, and the fourth shift register is connected to yet another of the first control line CL1, the second control line CL2, the third control line CL3, and the fourth control line.

It should be noted that, in the present embodiment, N is set as 4, similarly, N may alternatively be an integer such as 5, 6, 7, or 8. As N increases by 1, the pulse width of the gate drive signal Nscan1 output by the gate drive line increases by a half clock cycle.

In the present embodiment, for corresponding connection relationships between the shift registers and the control lines, reference may be made to the case where Nis 3. The connection relationships can be obtained by analogy, and are not described in detail herein.

In one embodiment, the gate drive circuit includes one or more groups of N shift registers, and each group of N shift registers are connected to N control lines that transmit control signals in different phases.

It should be noted that, as shown in FIG. 4, the first shift register, the second shift register, and the third shift register form a first group, and the fourth shift register, a fifth shift register, and a sixth shift register form a second group. The first group is connected to the first control line CL1, the second control line CL2, and the third control line CL3, and the second group is also connected to the first control line CL1, the second control line CL2, and the third control line CL3. In this way, different groups may share the first control line CL1, the second control line CL2, and the third control line CL3, thereby reducing a quantity of control lines needed, and achieving precisely control of output gate drive signals Nscan1 output by the gate drive lines.

In one embodiment, each of the control lines is connected to shift registers with a same cascading sequence in each group of N shift registers.

It should be noted that, as shown in FIG. 4, the first shift register and the fourth shift register have a same cascading sequence in the first group and the second group, the second shift register and the fifth shift register have a same cascading sequence in the in the first group and the second group, and the third shift register and the sixth shift register have a same cascading sequence in the first group and the second group. The first control line CL1 is connected to the first shift register and the fourth shift register, the second control line CL2 is connected to the second shift register and the fifth shift register, and the third control line CL3 is connected to the third shift register and the sixth shift register.

As shown in FIG. 5, after control ends of frequency division control modules 20 in different shift registers receive the first control signal Control2, the second control signal Control3, and the third control signal Control4 in different phases, when refresh frequencies of pixel circuits controlled by an 801st-stage shift register and subsequent shift registers need to be changed, the first control signal Control2 switches from a high potential to a low potential, the 801st-stage shift register controlled by the first control signal Control2 may output a gate drive signal Nscan1<801> with a pulse width having one and a half clock cycles, the 802nd-stage shift register controlled by the second control signal Control3 may also output a gate drive signal Nscan1<802> with a pulse width having one and a half clock cycles, the 803rd-stage shift register controlled by the third control signal Control4 may also output a gate drive signal Nscan1<803> with a pulse width having one and a half clock cycles, and similarly, the 804th-stage shift register may also output a gate drive signal Nscan1<804> with a pulse width having one and a half clock cycles. In this way, pixel circuits at a same refresh frequency have same charging time and same display effect.

Figure 6:
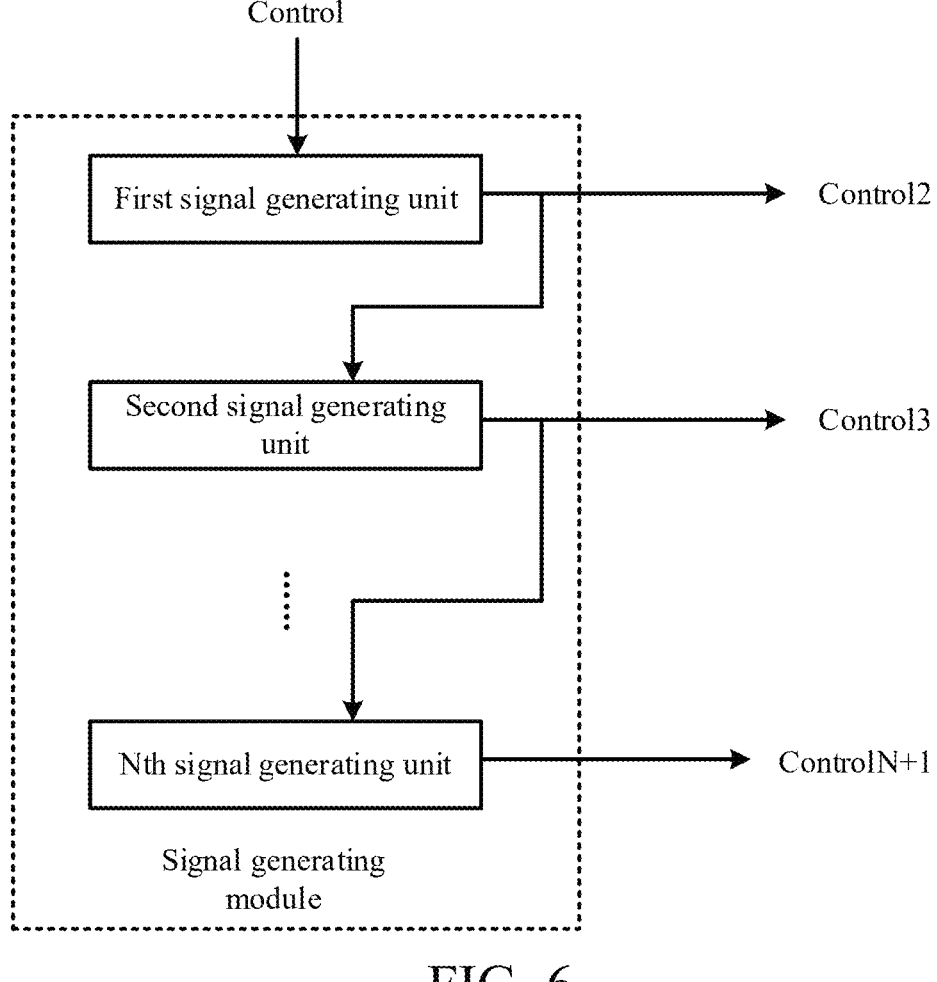
FIG. 6 is a schematic diagram of a structure of a signal generating module according to an embodiment of the present disclosure.

FIG. 6 is a schematic diagram of a structure of a signal generating module according to an embodiment of the present disclosure. It should be noted that the signal generating module includes N cascaded signal generating units such as a first signal generating unit, a second signal generating unit, . . . , and an Nth signal generating unit. In other words, a quantity of signal generating units is same as a quantity of shift registers in each of the shift register groups 111.

As shown in FIG. 5 and FIG. 6, the first signal generating unit shifts to generate the corresponding first control signal Control2 based an initial control signal Control, the second signal generating unit shifts to generate the corresponding second control signal Control3 based on the first control signal Control2, . . . , and the N signal generating unit shifts to generate the corresponding Nth control signal Control (N+1) based on the (N−1)th control signal. When N is equal to 3, the third signal generating unit shifts to generate the corresponding third control signal Control4 based on the second control signal Control3. As shown in FIG. 5, phases of the initial control signal Control, the first control signal Control2, the second control signal Control3, and the third control signal Control4 are sequentially lagged.

It should be noted that, N control signals with different phases and a same frequency may be generated by a drive chip based on the initial control signal, or may be generated by the signal generating module in the present embodiment. Only one input line is needed to transmit the initial control signal Control, and the signal generating module can generate more control signals as needed, so that a quantity of input lines needed, and space occupied by a frame is reduced.

In one embodiment, as shown in FIG. 7 to FIG. 9, the frequency division control module 20 includes a frequency division control transistor. A first electrode of the frequency division control transistor is connected to a first pull-up node P1, a second electrode of the frequency division control transistor is connected a second pull-up node, and a control electrode of the frequency division control transistor is connected to a control line.

It should be noted that, the frequency division control transistor may be a transistor T14 in FIG. 7 and FIG. 8, or may alternatively be a transistor T17 in FIG. 9, the frequency division control transistor may be, but not limited to, a P-channel thin film transistor. The frequency division control transistor may alternatively be an N-channel thin film transistor, and pulses of the control signals Control2/3/4 need to be adjusted into positive pulses.

A function of the frequency division control transistor in the present disclosure is to implement a corresponding refresh frequency. The control electrode may be a gate or a base.

In one embodiment, as shown in FIG. 7 and FIG. 8, a first output stage 10 includes a transistor T15 and a transistor T16. A first electrode of the transistor T16 is connected to a high-potential line, a gate of the transistor T16 is connected to the first pull-up node P1, and a second electrode of the transistor T16 is connected to a gate drive line. A first electrode of the transistor T15 is connected to a low-potential line, a gate of the transistor T15 is connected to the first pull-down node Q1, and a second electrode of transistor T15 is connected to the gate drive line.

It should be noted that both the transistor T15 and the transistor T16 may be P-channel thin film transistors. A high-potential line is configured to transmit a high-potential signal VGH. A low-potential line is configured to transmit a low-potential signal VGL.

In one embodiment, as shown in FIG. 8, the first output stage 10 further includes a capacitor C4, an end of the capacitor C4 is connected to a high-potential line, and another end of the capacitor C4 is connected to the gate of the transistor T16.

It should be noted that the capacitor C4 can improve an ON status of the transistor T16, thereby improving stability of the gate drive signal Nscan1.

In one embodiment, as shown in FIG. 9, a first output stage 10 includes a transistor T19, a transistor T20, and a capacitor C4, a high-potential line is connected to a first electrode of the transistor T20 and an end of the capacitor C4, a gate of the transistor T20 is connected to the first pull-up node P1, and a second electrode of the transistor T20 is connected to the gate drive line. A first electrode of the transistor T19 is connected to a low-potential line, a gate of the transistor T19 is connected to a first pull-down node Q, and a second electrode of the transistor T19 is connected to the gate drive line.

In one embodiment, as shown in FIG. 7 to FIG. 9, the gate drive circuit further includes a second output stage. A first control end of the second output stage is connected to the second pull-down node P, a second control end of the second output stage is connected to the first pull-up node Q1 in FIG. 7 and FIG. 8 or the first pull-up node Q in FIG. 9, and an input end of the second output stage is connected a cascading line.

In one embodiment, as shown in FIG. 7 to FIG. 9, the second output stage includes a transistor T9 and a transistor T10. A first electrode of the transistor T10 is connected to a high-potential line, a gate of the transistor T10 is connected to the second pull-up node P, and a second electrode of the transistor T10 is connected to the cascading line. A first electrode of the transistor T9 is connected to a low-potential line, a gate of the transistor T9 is connected to the first pull-down node Q1 in FIG. 7 and FIG. 8 or the first pull-down node Q in FIG. 9, and a second electrode of the transistor T9 is connected to the cascading line.

In one embodiment, as shown in FIG. 7 to FIG. 9, the second output stage further includes a capacitor C3. An end of the capacitor C3 is connected to a high-potential line, and another end of the capacitor C3 is connected to the gate of the transistor T10.

It should be noted that the capacitor C3 can improve an ON status of the transistor T10, thereby improving stability of a cascaded signal Nscan(n) output by the second output stage.

In one embodiment, as shown in FIG. 7 and FIG. 8, the shift register further includes a transistor T2. A first electrode of the transistor T2 is connected to the cascading line, a second electrode of the transistor T2 is electrically connected to the first pull-down node Q1, and a gate of the transistor T2 is connected to a first clock line.

It should be noted that the cascading line may be configured to transmit a cascaded signal Nscan(n−1). The first clock line is configured to transmit a first clock signal CK1. The transistor T2 may transmit the cascaded signal Nscan (n−1) to the first pull-down node Q1 under control of the first clock signal CK1.

In one embodiment, as shown in FIG. 7 and FIG. 8, the shift register further includes a transistor T13. A first electrode of the transistor T13 is connected to a second pull-down node Q and the second electrode of the transistor T2, a second electrode of the transistor T13 is electrically connected to the first pull-down node Q1, and a gate of the transistor T13 is connected to a low-potential line.

It should be noted that the transistor T13 is configured to prevent charge of the first pull-down node Q1 from flowing to the second pull-down node Q.

In one embodiment, as shown in FIG. 7 and FIG. 8, the shift register further includes a transistor T1. A first electrode of the transistor T1 is connected to a low-potential line, a second electrode of the transistor T1 is electrically connected to a second pull-up node, and a gate of the transistor T1 is connected to the first clock line.

It should be noted that the transistor T1 is configured to transmit the low potential signal to the second pull-up node P under control of the first clock signal CK1.

In one embodiment, as shown in FIG. 7 and FIG. 8, the shift register further includes a transistor T3. A first electrode of the transistor T3 is connected to the second electrode of the transistor T1, a second electrode of the transistor T3 is electrically connected to the second pull-up node, and a gate of the transistor T3 is connected to a low-potential line.

It should be noted that the transistor T1 is configured to prevent charge of the second pull-up node P from flowing to the second electrode of the transistor T1.

In one embodiment, as shown in FIG. 7 and FIG. 8, the shift register further includes a transistor T12. A first electrode of the transistor T12 is connected to a second pull-up node P, a second electrode of the transistor T12 is connected to the second electrode of the transistor T3, and a gate of the transistor T12 is connected to a second clock line.

It should be noted that the second clock line is configured to transmit a clock signal CK2. The transistor T12 is configured to control a connection relationship between the second pull-up node P and the second electrode of the transistor T3 based on the second clock signal CK2.

In one embodiment, as shown in FIG. 7 and FIG. 8, the shift register further includes a transistor T7 and a capacitor C2. A second electrode of the transistor T3 is connected to an end of the capacitor C2 and a gate of the transistor T7, a first electrode of the transistor T7 is connected to the second clock line, and a second electrode of the transistor T7 is connected to another end of the capacitor C2 and the second electrode of the transistor T12.

It should be noted that the transistor T7 is configured to control, based on a second electrode potential of the transistor T3, whether to transmit the clock signal CK2 to the second electrode of the transistor T12. The capacitor C2 is configured to improve an ON status of the transistor T7.

In one embodiment, as shown in FIG. 7 and FIG. 8, the shift register further includes a transistor T4. A first electrode of the transistor T4 is connected to the first clock line, a gate of the transistor T4 is connected to the second electrode of the transistor T2, and a second electrode of the transistor T4 is connected to the second electrode of the transistor T1.

It should be noted that the transistor T4 is configured to transmit a first clock signal CK1 to the second electrode of the transistor T1 under control of a potential of the second electrode of the transistor T2. The transistor T4 is a composite transistor formed by two transistors of a same channel type connected in series, to reduce charge flowing from second electrode of transistor T2 to the first clock line.

In one embodiment, as shown in FIG. 7 and FIG. 8, the shift register further includes a transistor T5, a transistor T6 and a capacitor T1. A first electrode of the transistor T5 is connected to a high-potential line, a gate of the transistor T5 is connected to the second electrode of the transistor T1, a second electrode of the transistor T5 is connected to an end of the capacitor C1 and a first electrode of the transistor T6, another end of the capacitor C1 is connected to the first pull-down node Q1 and a gate of the transistor T6, and a second electrode of the transistor T6 is connected to the second clock line.

It should be noted that, when the cascaded signal Nscan (n−1) is a high pulse signal, the first clock signal CK1 is at a low potential, the transistor T4 is turned off, a gate potential of the transistor T5 is VGL (a potential of a low-potential signal VGL), and VGH (a potential of a high-potential signal VGH) enters an intermediate node connected between the transistor T5 and the transistor T6, and when a potential of a node D. In this case, a potential of the second pull-up node P is VGL, the transistor T10 is turned on, and the cascaded signal Nscan(n) is at a high potential.

When the cascaded signal Nscan(n−1) is pulled down, the transistor T13 is turned on, the potential of the second pull-down node Q is VGL−Vth (Vth is a threshold voltage of the transistor T2), a potential output by the cascaded signal Nscan(n) through the transistor T9 is VGL−Vth.

When the transistor T4 is turned on, a high potential of the first clock signal CK1 is output to the gate of the transistor T5. When the transistor T5 is turned off, a low potential of the second clock signal CK2 is output to the intermediate node connected between the transistor T5 and the transistor T6, a potential jump of the intermediate node, which is coupled to a potential of the first pull-down node Q1 via the capacitor C1, pulls the potential of the first pull-down node Q1 down to a potential lower than VGL, so that the transistor T9 is turned on completely, and the potential of the cascaded signal Nscan(n) is VGL.

In one embodiment, as shown in FIG. 7 and FIG. 8, the shift register further includes a transistor T8. A first electrode of the transistor T8 is connected to a high-potential line, a gate of the transistor T8 is connected to the second pull-down node Q, and a second electrode of the transistor T8 is connected to the second pull-up node P.

It should be noted that the transistor T8 is configured to pull the potential of the second pull-up node P up to a high potential when the potential of the second pull-down node Q is low, to improve reliability of the shift register.

In one embodiment, as shown in FIG. 7 and FIG. 8, the shift register further includes a transistor T11. A first electrode of the transistor T11 is connected to a high-potential line, a gate of the transistor T11 is connected to the second pull-down node Q, and a second electrode of the transistor T11 is connected to the first pull-up node P1.

It should be noted that the transistor T11 is configured to pull the potential of the first pull-up node P1 up to a high potential when the potential of the second pull-down node Q is low, to further improve reliability of the shift register.

In one embodiment, as shown in FIG. 9, the shift register further includes the transistor T3 and the transistor T12. The first electrode of the transistor T3 is connected to a start control line, the gate of the transistor T3 is connected to the first clock line, the second electrode of the transistor T3 is connected to the first electrode of the transistor T12, the gate of the transistor T12 is connected to a low-potential line, and the second electrode of the transistor T12 is connected to the first pull-down node Q.

It should be noted that, in FIG. 9, the first clock line is configured to transmit a first clock signal XCK. The start control line is configured to transmit a start control signal STV.

In one embodiment, as shown in FIG. 9, the shift register further includes the transistor T13. The first electrode of the transistor T13 is connected to a high-potential line, the gate of the transistor T13 is connected to a global control line, and the second electrode of the transistor T13 is connected to the second electrode of the transistor T3.

It should be noted that the global control line is configured to transmit a global control signal GC. During an initialization stage of the gate drive circuit, the transistor T13 is configured to pull a second electrode potential of the transistor T3 up to a high potential under control of the global control signal GC. During a normal display stage, the transistor T13 is in an OFF state.

In one embodiment, as shown in FIG. 9, the shift register further includes the transistor T4. A first electrode of the transistor T4 is connected to a low-potential line, a gate of the transistor T4 is connected to the first clock line, and a second electrode of the transistor T4 is connected to a node N2.

In one embodiment, as shown in FIG. 9, the shift register further includes a transistor T11. A first electrode of the transistor T11 is connected to the node N2, a gate of the transistor T11 is connected to a low-potential line, and a second electrode of the transistor T11 is connected to a node N1.

In one embodiment, as shown in FIG. 9, the shift register further includes a transistor T6, a transistor T7, and a capacitor C2. The node N1 is connected to an end of the capacitor C2 and a gate of the transistor T6, a first electrode of the transistor T6 is connected to the second clock line, a second electrode of the transistor T6 is connected to another end of the capacitor C2 and a first electrode of the transistor T7, a second electrode of the transistor T7 is connected to the second pull-up node P, and a gate of the transistor T7 is connected to the second clock line It should be noted that, in FIG. 9, the second clock line is configured to transmit a second clock signal CK. When a potential of the node N1 is low, the transistor T6 is turned on, a low potential of the second clock signal CK is output to a connection node between the transistor T6 and the transistor T7, a potential jump of the connection node coupled via the capacitor C2 causes a potential of the node N1 to be lower than VGL (the potential of the low potential signal VGL), to ensure that the transistor T6 is turned on completely. A potential of the connection node is VGL.

In one embodiment, as shown in FIG. 9, the shift register further includes a transistor T5. A first electrode of the transistor T5 is connected to the first clock line, a gate of the transistor T5 is connected to the second electrode of the transistor T3, and a second electrode of the transistor T5 is connected to the node N2.

In one embodiment, as shown in FIG. 9, the shift register further includes the transistor T1, the transistor T2 and a capacitor C1. A first electrode of the transistor T1 is connected to a high-potential line, a gate of the transistor T1 is connected to the node N2, a second electrode of the transistor T1 is connected to an end of the capacitor C1 and a first electrode of the transistor T2, a second electrode of the transistor T2 is connected to a second clock line, and a gate of the transistor T2 is connected to another end of the capacitor C1 and a node D.

In one embodiment, as shown in FIG. 9, the shift register further includes a transistor T14, a transistor T15 and a transistor T16. A first electrode of the transistor T14 is connected to the start control line, a gate of the transistor T14 is connected to the first clock line, a second electrode of the transistor T14 is connected to a first electrode of the transistor T15, a gate of the transistor T15 is connected to a low-potential line, a second electrode of the transistor T15 is connected to the node D, the node D is connected to a gate of the transistor T16 and a first electrode of the transistor T16, and a second electrode of the transistor T16 is connected to the first pull-down node Q.

It should be noted that, when a potential of the start control signal STV varies from high to low, a coupling effect to the node D is caused, and can pull down a potential of the node D. In this case, the transistor T16 is in a diode connection. After the potential of the node D is impulsed to the first pull-down node Q, a potential of the first pull-down node Q is not affected by change of the potential of the node D and remains at a low potential. In this way, the transistor T9 achieves a good continuous-on effect and stable outputting.

In one embodiment, as shown in FIG. 9, the shift register further includes a transistor T8. A first electrode of the transistor T8 is connected to a high-potential line, a gate of the transistor T8 is connected to the second electrode of the transistor T3, and a second electrode of the transistor T8 is connected to the second pull-up node P.

In one embodiment, as shown in FIG. 9, the shift register further includes a transistor T18. A first electrode of the transistor T18 is connected to a high-potential line, a gate of the transistor T18 is connected to the second electrode of the transistor T3, and a second electrode of the transistor T18 is connected to the second pull-up node P1.

FIG. 10 is a time sequence of a gate drive circuit shown in FIG. 4, and is described as follows.

A control end of a frequency division control module 20 in the 800th-stage shift register receives the third control signal Control4. When a potential Nscan_P<800> of the second pull-up node P in the 800th-stage shift register is low, a potential of the third control signal Control4 is high, the frequency division control module 20 is turned off, the Nscan_P<800> in a low potential cannot refresh a potential Nscan_P1<800> of the first pull-up node P1 in the 800th-stage shift register, the transistor T16 as shown in FIG. 7 and FIG. 8 or a transistor T20 as shown in FIG. 9 in a first output stage 10 is always off, and the potential Nscan_P<800> of the gate drive signal Nscan1 output VGL continuously.

The control end of the frequency division control module 20 in the 801st-stage shift register receives the first control signal Control2. When a potential Nscan_P<801> of a second pull-up node P in the 801st-stage shift register is low, a potential of the first control signal Control2 is low, the frequency division control module 20 is turned on, the Nscan_P<801> in a low potential pull down a potential Nscan_P1<801> of the first pull-up node P1 in the 801st-stage shift register, the transistor T16 as shown in FIG. 7 and FIG. 8 or a transistor T20 as shown in FIG. 9 in a first output stage 10 is turned on, and the potential Nscan_P1<801> of the gate drive signal Nscan1 output VGH. When a node in the 801st-stage shift register is low, the potential Nscan1<801> of the gate drive signal Nscan1 outputs VGL, and outputting of a potential pulse of the gate drive signal Nscan1 is completed.

The control end of the frequency division control module 20 in the 802nd-stage shift register receives the second control signal Control3. When a potential Nscan_P<802> of a second pull-up node P in the 802nd-stage shift register is low, a potential of the second control signal Control3 is low, the frequency division control module 20 is turned on, the Nscan_P<802> in a low potential pull down a potential Nscan_P1<802> of the first pull-up node P1 in the 802nd-stage shift register, the transistor T16 as shown in FIG. 7 and FIG. 8 or a transistor T20 as shown in FIG. 9 in a first output stage 10 is turned on, and the potential Nscan<802> of the gate drive signal Nscan1 outputs VGH. When a node in the 802nd-stage shift register is low, the potential Nscan1<802> of the gate drive signal Nscan1 outputs VGL, and outputting of a potential pulse of the gate drive signal Nscan1 is completed.

A time interval between two adjacent dotted lines as shown in FIG. 10 is a half clock cycle. For example, from left to right, a phase ① between a first dotted line and a second dotted line is a half clock cycle, a phase ② between the second dotted line and a third dotted line is a half clock cycle, a phase ③ between the third dotted line and a fourth dotted line is also a half clock cycle, a phase ④ between the fourth dotted line and a fifth dotted line is also a half clock cycle, a phase ⑤ between the fifth dotted line and a sixth dotted line is also a half clock cycle, and a phase 6 after the sixth dotted line is a pulse outputting end period of the gate drive signal Nscan1.

A half clock cycle is a half cycle of the first clock signal CK1/XCK, and may alternatively be a half cycle of the second clock signal CK2/CK.

It should be noted that, if Nscan_P1<801> is not processed by the gate drive circuit as shown in FIG. 4, control ends of the frequency division control modules 20 in the shift registers all receive the third control signal Control4, a phase of the Nscan_P1<801> is lagged by one clock cycle, and a pulse width of the Nscan_P1<801> is reduced by one clock cycle, to obtain the Nscan1<801> as shown in FIG. 3.

Similarly, if Nscan_P1<802> is not processed by the gate drive circuit as shown in FIG. 4, control ends of the frequency division control modules 20 in the shift registers receive the third control signal Control4, a phase of the Nscan_P1<802> is lagged by a half clock cycle, and a pulse width of the Nscan_P1<801> is reduced by a half clock cycle, to obtain the Nscan1<802> as shown in FIG. 3.

Therefore, the gate drive circuit as shown in FIG. 4 can mitigate a technical problem that a pulse width of a gate drive signal is narrow in an initial stage of refresh frequency switching in frequency division display.

In one embodiment, the present embodiment provides a display panel including the gate drive circuit according to at least one of the foregoing embodiments.

It should be understood that, because the display panel provided in the present embodiment includes the gate drive circuit according to at least one of the foregoing embodiments, similarly, control ends of the frequency division control modules 20 in three or more sequentially cascaded shift registers receive the control signals with different phases via different control lines, to control ON time of the frequency division control modules 20 to be overlapped as much as possible with pulse time of gate drive signals Nscan1 output by the first output stages 10, so that the pulse of the gate drive signal Nscan1 can be controlled to be wider, and the pulse width of the gate drive signal Nscan1 can remain unchanged in a case of refresh frequency switching, thereby mitigating a problem that the pulse width of the gate drive signal Nscan1 is narrow in an initial stage of refresh frequency switching in frequency division display.

In addition, each of control signals in different phases may increase a half clock cycle for the pulse width of the gate drive signal Nscan1, so that the pulse width of the gate drive signal Nscan1 can be controlled more precisely, and the pulse width of the gate drive signal Nscan1 can be adjusted more flexibly.

In one embodiment, the foregoing display panel further includes a pixel circuit in FIG. 1. The pixel circuit includes a drive transistor T1, a compensation transistor T3, and a write transistor T2. A first electrode of the compensation transistor T3 is connected to a gate of the drive transistor T1, a second electrode of the compensation transistor T3 is connected to a first electrode or a second electrode of the drive transistor T1, and a gate of the compensation transistor T3 is connected into a gate drive line. A first electrode of a write transistor T2 is connected to the first electrode or the second electrode of the drive transistor T1, a second electrode of the write transistor T2 is connected to a data line, and a gate of the write transistor T2 is connected to a scan line.

It should be noted that, when the gate drive circuit in at least one of the foregoing embodiments is used together with the pixel circuit, each row of pixel circuit can perform display at an expected refresh frequency in a case that each gate drive line is connected to the gate of the compensation transistor T3 in each row of pixel circuit.

In one embodiment, as shown in FIG. 1, the pixel circuit further includes a first light-emitting control transistor T5. A first electrode of the first light-emitting control transistor T5 is connected to a first power line, a second electrode of the first light-emitting control transistor T5 is connected to a first electrode of the drive transistor T1, and a gate of the light-emitting control transistor T5 is connected to a light-emitting control line.

It should be noted that the first power line is configured to transmit a power positive signal VDD. The light-emitting control line is configured to transmit a light-emitting control signal EM.

In one embodiment, as shown in FIG. 1, the pixel circuit further includes a second light-emitting control transistor T6 and a light-emitting component D1. A first electrode of the second light-emitting control transistor T6 is connected to the second electrode of the drive transistor T1, a second electrode of the second light-emitting control transistor T6 is connected to a positive electrode of the light-emitting component D1, and a gate of the second light-emitting control transistor T6 is connected to the light-emitting control line. A negative electrode of the light-emitting component D1 is connected to a second power line.

It should be noted that the second power line is configured to transmit a power negative signal VSS. The light-emitting component D1 may be an organic light-emitting diode, a mini-light-emitting diode, a micro-light-emitting diode, or a quantum dot light-emitting diode.

In one embodiment, as shown in FIG. 1, the pixel circuit further includes a storage capacitor Cst. An end of the storage capacitor Cst is connected to the gate of the drive transistor T1, and another end of the storage capacitor Cst is connected to the first power line.

In one embodiment, as shown in FIG. 1, the pixel circuit further includes a bootstrap capacitor Cboost. An end of the bootstrap capacitor Cboost is connected to the gate of the drive transistor T1, and another end of the bootstrap capacitor Cboost is connected to the gate of the write transistor T2.

In one embodiment, as shown in FIG. 1, the pixel circuit further includes a first reset transistor T4. A first electrode of the first reset transistor T4 is connected to the gate of the drive transistor T1, a second electrode of the first reset transistor T4 is connected to a first reset line, and a gate of the first reset transistor T4 is connected to the gate drive line.

It should be noted that the first reset line is configured to transmit a first reset signal Vi_G. The gate drive line is configured to transmit a gate drive signal Nscan2, and the gate drive line may be the foregoing cascading line or another gate drive line.

In one embodiment, as shown in FIG. 1, the pixel circuit further includes a second reset transistor T7. A first electrode of the second reset transistor T7 is connected to a positive electrode of the light-emitting component D1, a second electrode of the second reset transistor T7 is connected to a second reset line, and a gate of the second reset transistor T7 is connected to the gate drive line.

It should be noted that the first reset line is configured to transmit a second reset signal Vi_ANo. The gate drive line is configured to transmit a gate drive signal Pscan2.

In one embodiment, as shown in FIG. 1, the pixel circuit further includes a third reset transistor T8. A first electrode of the third reset transistor T8 is connected to the first electrode of the drive transistor T1, a second electrode of the third reset transistor T8 is connected to a third reset line, and a gate of the third reset transistor T8 is connected to the gate drive line.

It should be noted that the third reset line is configured to transmit a third reset signal Vi3.

Figure 11:
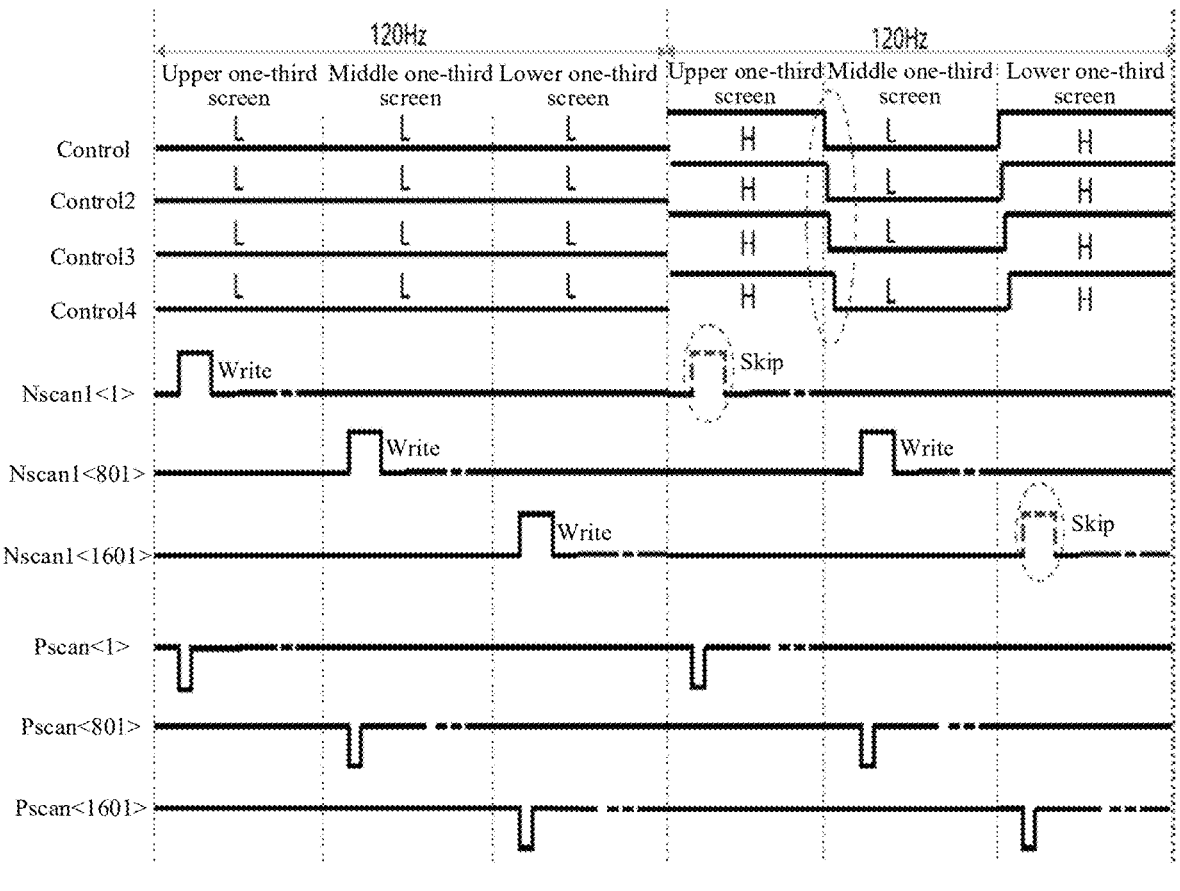
FIG. 11 is a schematic diagram of a time sequence of a display panel according to some embodiments of the present disclosure.

A process of foregoing frequency division or split-screen display of the display panel is described with reference to FIG. 11. An example in which 120 Hz is a highest refresh frequency, an upper one-third screen performs display with a refresh frequency of 60 Hz, a middle one-third screen performs display with a refresh frequency of 120 Hz, and a lower one-third screen performs display with a refresh frequency of 30 Hz. A frame with a refresh frequency of 60 Hz may be divided into two frames with a refresh frequency of 120 Hz, and a frame with a refresh frequency of 30 Hz may be divided into four frames with a refresh frequency of 120 Hz. Details are described as follows.

In a first frame with a refresh frequency of 120 Hz, control signals Control2/3/4 received by shift registers corresponding to the upper one-third screen, the middle one-third screen, the lower one-third screen are all in a low potential L, all frequency division control modules 20 are turned on, and all gate drive signals Nscan<1> . . . Nscan<801> . . . Nscan<1601> output corresponding pulses sequentially, and all scan signals Pscan<1> . . . Pscan<801> . . . Pscan<1601> also output corresponding pulses sequentially, to control a data signal Data to be written into gates in drive transistors T1 in pixel circuits.

In a second frame with a refresh frequency of 120 Hz, control signals Control2/3/4 received by shift registers corresponding to the upper one-third screen and the lower one-third screen are all in a high potential H, all frequency division control modules 20 in shift registers in the upper one-third screen and the lower one-third screen are turned off, and all gate drive signals Nscan<1> . . . Nscan<801> . . . Nscan<1601> stop outputting corresponding pulses, and at the same time, scan signals Pscan<1> . . . Pscan<801> . . . Pscan<1601> still output corresponding pulses, to control the data signal Data to be written into sources or drains in the drive transistors T1 in the pixel circuits.

Control signals Control2/3/4 received by shift registers corresponding to the middle one-third screen are all in a low potential L, all frequency division control modules 20 of shift registers in the middle one-third screen are turned on, and all gate drive signals Nscan<801> . . . Nscan<1600> output corresponding pulses sequentially, and at the same time, scan signals Pscan<801> . . . Pscan<1601> also output corresponding pulses, to control the data signal Data to be written into gates in the drive transistors T1 in the pixel circuits.

In a third frame with a refresh frequency of 120 Hz, the upper one-third screen remains a state same as that in the first frame with a refresh frequency of 120 Hz, the middle one-third screen also remains a state same as that in the first frame with a refresh frequency of 120 Hz, and the lower one-third screen remains a state same as that in the second frame with a refresh frequency of 120 Hz.

In a fourth frame with a refresh frequency of 120 Hz, the upper one-third screen remains the state same as that in the second frame with a refresh frequency of 120 Hz, the middle one-third screen remains the state same as that in the first frame with a refresh frequency of 120 Hz, and the lower one-third screen remains the state same as that in the second frame with a refresh frequency of 120 Hz.

The upper one-third screen completes a frame with a refresh frequency of 60 Hz in the first frame with a refresh frequency of 120 Hz and the second frame with a refresh frequency of 120 Hz, and the upper one-third screen also completes a frame with a refresh frequency of 60 Hz in the third frame with a refresh frequency of 120 Hz and the fourth frame with a refresh frequency of 120 Hz.

The middle one-third screen completes a frame with a refresh frequency of 120 Hz in any one of the first frame with a refresh frequency of 120 Hz, the second frame with a refresh frequency of 120 Hz, the third frame with a refresh frequency of 120 Hz, and the fourth frame with a refresh frequency of 120 Hz.

The lower one-third screen completes a frame with a refresh frequency of 30 Hz in the first frame with a refresh frequency of 120 Hz, the second frame with a refresh frequency of 120 Hz, the third frame with a refresh frequency of 120 Hz, and the fourth frame with a refresh frequency of 120 Hz.

According to the foregoing descriptions, the foregoing split-screen technology may be implemented using a complete gate drive circuit. In this way, costs can be reduced, compared with implementing each of the upper one-third screen, the middle one-third screen, the lower one-third screen by using one gate drive circuit.

In particular, when the foregoing display panel is used as a folded screen, one or two of the upper one-third screen, the middle one-third screen, and the lower one-third screen may be a main screen or main screens, the other one or two of the upper one-third screen, the middle one-third screen, and the lower one-third screen may be a secondary screen or secondary screens.

In the foregoing embodiments, the descriptions of the embodiments have respective focuses. For a part that is not detailed in an embodiment, reference may be made to relevant description of other embodiments.

The foregoing describes the gate drive circuit and the display panel provided in embodiments of the present disclosure in details. Specific examples are used in this specification to describe principles and implementations of this present disclosure. Descriptions of the foregoing embodiments are merely used to help understand the technical solutions and core ideas of this present disclosure. It should be appreciated by a person skilled in the art that modifications may still be made to the technical solutions described in the foregoing embodiments, or equivalent replacements may be made to a part of the technical features. These modifications or replacements shall not cause the essence of corresponding technical solutions to depart from the scope of the technical solutions in the embodiments of the present disclosure.

What is claimed is:

1. A gate drive circuit, comprising N sequentially cascaded shift registers, N being greater than or equal to 3, each shift register comprising a first output stage and a frequency division control module, a first control end of the first output stage being connected to a first pull-up node, a second control end of the first output stage being connected to a first pull-down node, and an output end of the first output stage being connected to a gate drive line, an end of the frequency division control module being connected to the first pull-up node, and another end of the frequency division control module being connected to a second pull-up node, wherein control ends of the frequency division control modules in N shift registers are respectively connected to N control lines that transmit control signals in different phases, and the control end of the frequency division control module in each shift register is connected to a control line.

2. The gate drive circuit of claim 1, wherein the N shift registers comprise a first shift register, a second shift register, and a third shift register cascaded sequentially, the N control lines that transmit control signals in different phases comprise a first control line, a second control line and a third control line that transmit control signals with sequentially lagged phases, one of the first shift register, the second shift register, and the third shift register is connected to one of the first control line, the second control line, and the third control line, another of the first shift register, the second shift register, and the third shift register is connected to another of the first control line, the second control line, and the third control line, and a remaining one of the first shift register, the second shift register, and the third shift register is connected to a remaining one of the first control line, the second control line, and the third control line.

3. The gate drive circuit of claim 2, wherein the N shift registers further comprise a fourth shift register cascaded after the third shift register, the N control lines that transmit control signals in different phases further comprise a fourth control line, a phase of a control signal transmitted by the fourth control line is lagged than a phase of the control signal transmitted by the third control line, a yet another of the first shift register, the second shift register, the third shift register, and the fourth shift register is connected to a yet another of the first control line, the second control line, the third control line, and the fourth control line.

4. The gate drive circuit of claim 1, wherein the gate drive circuit comprises one or more groups of N shift registers, and each group of N shift registers are connected to N control lines that transmit control signals in different phases.

5. The gate drive circuit of claim 4, wherein each of the control lines is connected to shift registers with a same cascading sequence in each group of N shift registers.

6. The gate drive circuit of claim 1, wherein the frequency division control module comprises a frequency division control transistor, a first electrode of the frequency division control transistor is connected to the first pull-up node, a second electrode of the frequency division control transistor is connected the second pull-up node, and a control electrode of the frequency division control transistor is connected to a control line.

7. The gate drive circuit of claim 1, wherein the gate drive circuit further comprises a second output stage, a first control end of the second output stage is connected to the second pull-down node, a second control end of the second output stage is connected to the first pull-up node, and an input end of the second output stage is connected a cascading line.

8. The gate drive circuit of claim 7, wherein the second output stage comprises a first transistor and a second transistor, a first electrode of the second transistor is connected to a high-potential line, a gate of the second transistor is connected to the second pull-up node, and a second electrode of the second transistor is connected to the cascading line, a first electrode of the first transistor is connected to a low-potential line, a gate of the first transistor is connected to the first pull-down node, and a second electrode of the first transistor is connected to the cascading line.

9. The gate drive circuit of claim 8, wherein the second output stage further comprises a capacitor, an end of the capacitor is connected to a high-potential line, and another end of the capacitor is connected to the gate of the second transistor.

10. A display panel, comprising:

a gate drive circuit, comprising N sequentially cascaded shift registers, N being greater than or equal to 3, each shift register comprising a first output stage and a frequency division control module, a first control end of the first output stage being connected to a first pull-up node, a second control end of the first output stage being connected to a first pull-down node, and an output end of the first output stage being connected to a gate drive line, an end of the frequency division control module being connected to the first pull-up node, and another end of the frequency division control module being connected to a second pull-up node, wherein control ends of the frequency division control modules in N shift registers are respectively connected to N control lines that transmit control signals in different phases, and the control end of the frequency division control module in each shift register is connected to a control line;

a pixel circuit, comprising a drive transistor, a compensation transistor, and a write transistor, a first electrode of the compensation transistor is connected to a gate of the drive transistor, a second electrode of the compensation transistor is connected to a first electrode or a second electrode of the drive transistor, and a gate of the compensation transistor is connected into a gate drive line, a first electrode of the write transistor is connected to the first electrode or the second electrode of the drive transistor, a second electrode of the write transistor is connected to a data line, and a gate of the write transistor is connected to a scan line.

11. The display panel of claim 10, wherein the pixel circuit further comprises a first light-emitting control transistor, a first electrode of the first light-emitting control transistor is connected to a first power line, a second electrode of the first light-emitting control transistor is connected to the first electrode of the drive transistor, and a gate of the first light-emitting control transistor is connected to a light-emitting control line.

12. The display panel of claim 11, wherein the pixel circuit further comprises a second light-emitting control transistor and a light-emitting component, a first electrode of the second light-emitting control transistor is connected to the second electrode of the drive transistor, a second electrode of the second light-emitting control transistor is connected to a positive electrode of the light-emitting component, and a gate of the second light-emitting control transistor is connected to the light-emitting control line, a negative electrode of the light-emitting component is connected to a second power line.

13. The display panel of claim 11, wherein the pixel circuit further comprises a storage capacitor, an end of the storage capacitor is connected to the gate of the drive transistor, and another end of the storage capacitor is connected to the first power line.

14. The display panel of claim 11, wherein the pixel circuit further comprises a first reset transistor, a first electrode of the first reset transistor is connected to the gate of the drive transistor, a second electrode of the first reset transistor is connected to a first reset line, and a gate of the first reset transistor is connected to the gate drive line.

15. The display panel of claim 14, wherein the pixel circuit further comprises a second reset transistor, a first electrode of the second reset transistor is connected to the positive electrode of the light-emitting component, a second electrode of the second reset transistor is connected to a second reset line, and a gate of the second reset transistor is connected to the gate drive line.

16. The display panel of claim 15, wherein the pixel circuit further comprises a third reset transistor, a first electrode of the third reset transistor is connected to the first electrode of the drive transistor, a second electrode of the third reset transistor is connected to a third reset line, and a gate of the third reset transistor is connected to the gate drive line.

17. The display panel of claim 10, wherein the pixel circuit further comprises a bootstrap capacitor, an end of the bootstrap capacitor is connected to the gate of the drive transistor, and another end of the bootstrap capacitor is connected to the gate of the write transistor T2.

* * * * *